United States Patent [19]

Sloane

[11] Patent Number: 4,833,631
[45] Date of Patent: May 23, 1989

[54] SYSTEM FOR PARAMETER IDENTIFICATION OF ANALOG SIGNALS

[75] Inventor: Edwin A. Sloane, Los Altos, Calif.

[73] Assignee: Schlumberger Systems and Services, Inc., Sunnyvale, Calif.

[21] Appl. No.: 36,751

[22] Filed: Apr. 10, 1987

[51] Int. Cl.⁴ .......................... G01R 27/00; G06J 1/00
[52] U.S. Cl. ................................ 364/602; 324/57 PS; 324/77 E; 364/485; 364/489
[58] Field of Search ............... 364/600, 601, 602, 604, 364/484, 485, 486, 487, 488, 489, 553; 324/77 R, 77 A, 77 B, 77 D, 77 E, 57 R, 57 PS, 58 A

[56] References Cited

U.S. PATENT DOCUMENTS 2,963,647 12/1960 Dean .............................. 364/486 X
3,393,301 7/1968 Valstar ........................ 324/77 E X Primary Examiner—Charles E. Atkinson
Assistant Examiner—Stephen M. Baker
Attorney, Agent, or Firm—Theodore S. Park; Robert C. Colwell; Charles E. Krueger

[57] ABSTRACT

A system for determining the s-plane parameters, $s_i$ and $r_i$, of the transient response, $$\sum_i r_i e^{s_i t},$$

of a network-under-test (NUT). A filter bank, including N serially connected filter elements, has an input port and N output ports being the output ports of the filter elements. The system includes circuitry for sampling the response signal, at the N filter bank output ports, T seconds after a transient signal is received at the input port. A processor utilizes the values of the sampled response signal to determine the values of $s_i$ and $r_i$.

5 Claims, 3 Drawing Sheets

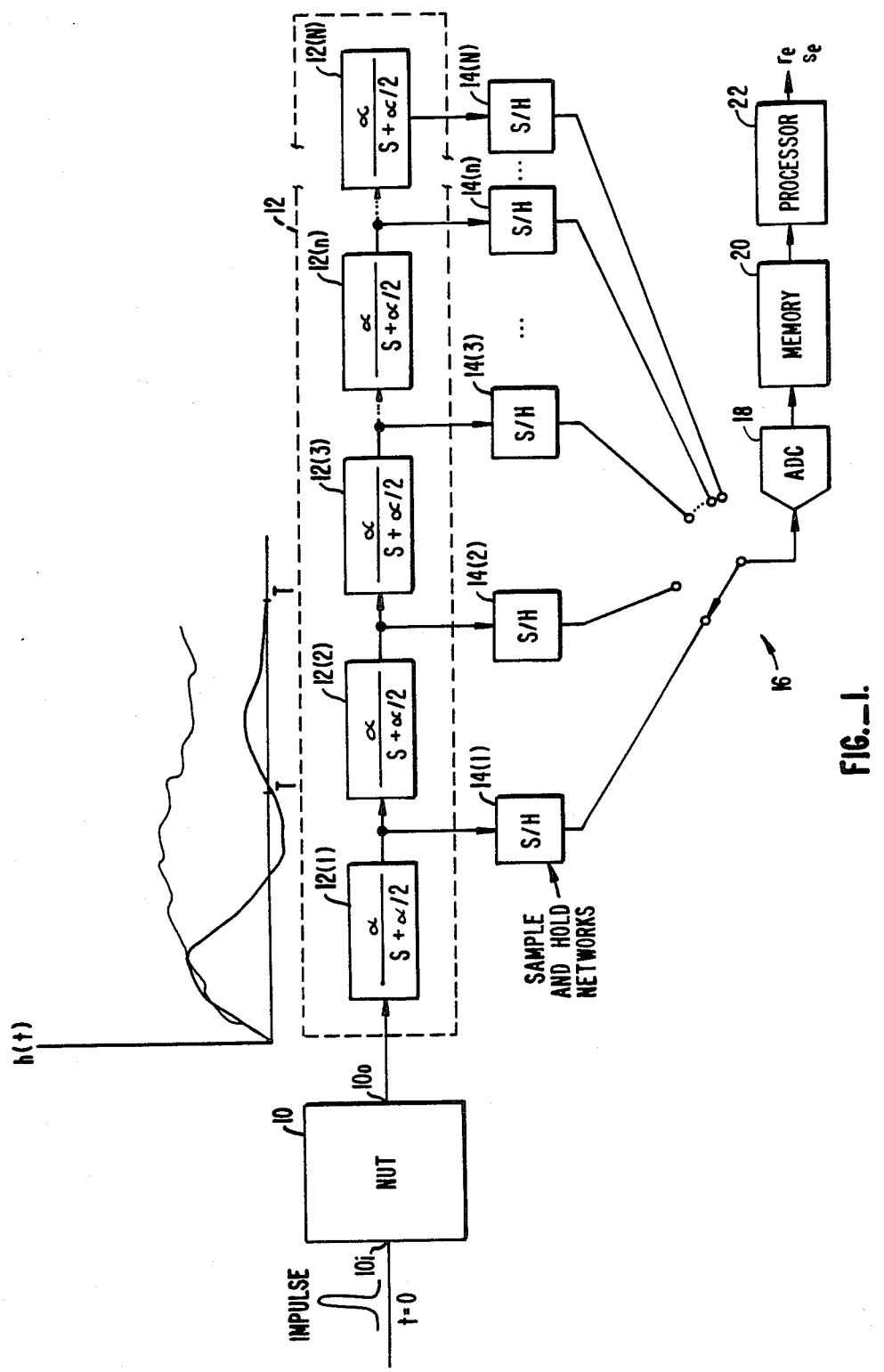
FIG._1.

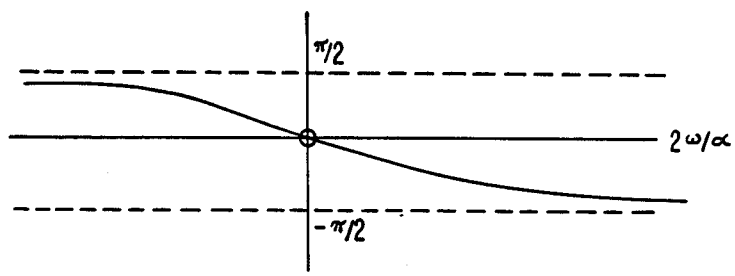
FIG.__2.
FIG.__3.
L.H. COLUMNS    MIDDLE COLUMNS    R.H. COLUMNS $$P' = \begin{bmatrix} \mu_0 & & & & & 0 & \vdots & 1 & & & 0 & \vdots & 0 & & & 0 \\ \mu_1 & \mu_0 & & & & & \vdots & \gamma_1 & 1 & & & \vdots & y_0 & 0 & & \\ \mu_2 & \mu_1 & \mu_0 & & & & \vdots & \gamma_2 & \gamma_1 & 1 & & \vdots & y_1 & y_0 & 0 & \\ \mu_3 & \mu_2 & \mu_1 & \ddots & & & \vdots & \gamma_3 & \gamma_2 & \gamma_1 & \ddots & \vdots & y_2 & y_1 & & \ddots \\ & & & & \mu_0 & & \vdots & & & & 1 & \vdots & & & & 0 \\ \vdots & & & & & & \vdots & \vdots & & & & \vdots & \vdots & & & \vdots \\ \mu_{N-1} & \mu_{N-2} & \mu_{N-3} & \cdots & \mu_{N-(P+1)} & & \gamma_{N-1} & \gamma_{N-2} & \cdots & \gamma_{N-(P+1)} & & y_{N-2} & y_{N-3} & \cdots & y_{N-P} \end{bmatrix}$$

L.H. COLUMNS      MIDDLE COLUMNS      R.H. COLUMNS

SYSTEM FOR PARAMETER IDENTIFICATION OF ANALOG SIGNALS

BACKGROUND OF THE INVENTION

Many applications of signal processing require the sampling of a non-bandwidth limited signal. As is well known in the art, an aliasing error will be introduced if the Nyquist criterion, i.e., the relationship $$\pi/T \leq \omega_{max}$$

is not satisfied, where T is the sampling interval and $\omega_{max}$ is the upper frequency limit of a sampled signal. Thus, any accurate reconstruction of the sampled signal utilizing the erroneous sampled values would be impossible.

A system for sampling a steady-state, non-bandwidth limited signal without aliasing is described in a co-pending, commonly assigned patent application to the same inventor entitled "A System For Converting Analog Signals To A Discrete Representation Without Aliasing" Ser. No. 036,763 Apr. 9, 1987. This application is hereby incorporated by reference.

However, many signals of interest include transient components, e.g., decaying exponentials, and are not suitable for analysis by the above-described system.

One example of such a transient signal is the impulse response of a linear system. A linear system is characterized by its natural resonances that are of the form $$\sum_{i=0}^{p} , r_{1,i} e^{s_i t} + r_{2,i} t e^{s_i t} + \ldots + r_{n,i} \frac{t^{n-1}}{(n-1)!} e^{s_i t} + \ldots$$

where the quantities $s_i$ are the natural frequencies of the system and the quantities $r_{n,i}$ are the resonant amplitudes of the frequency components. Additionally, the quantities $s_i$ and $r_{n,i}$ are the poles and residues, respectively, of the frequency transform function, H(s), of the linear system. Succeeding terms in the above expression represent higher order resonances at the same natural frequency $s_i$.

Thus, the quantities $s_i$ and $r_{n,i}$ are s-plane parameters describing the continuous analog signal.

A system containing single order poles only, has an impulse response $$h_s(t) = \Sigma r_i e^{s_i t}$$

which is characteristic of the system and contains the necessary information for describing the poles and residues of the network. For the sake of simplicity in presentation and without any real loss in generality, systems with only single order poles are considered.

Methods have been developed for estimating the parameters $s_i$ and $r_i$ from sampled values of h(t) taken $\tau$ seconds apart. According to the Nyquist theorem, these sampled values closely approximate h(t) if the spectral energy of h(t) is essentially limited to a frequency less than $f_m = \frac{1}{2}\tau$.

Any physical system has an infinite bandwidth because each resonance (pole) has a frequency response that drops off at a finite rate. Therefore, any finite sampling rate will violate the Nyquist criterion thereby causing aliasing errors to prevent an accurate determination of $s_i$ and $r_i$.

An accurate determination of the s-plane parameters is important for a number of reasons. These parameters define the impulse response of the system. The impulse response determines the response of the system to transient test stimuli, such as step functions, and thus its characterization is critical in high speed testing environments. Secondly, the s-plane parameters define the transfer function of the system. Accurate measurement of the s-plane parameters would facilitate a compensation system for a less than ideal transfer characteristic of a physical system.

Accordingly, a system for sampling an analog signal, including a transient component, without aliasing is greatly needed in the signal processing art. The resulting samples would be of great utility in reconstructing the analog signal.

SUMMARY OF THE INVENTION

According to the invention, an analog input signal in the general form:

$$h(t) = \sum_{1} r_i e^{s_i t}$$

is provided to the input port a specially configured filter network having an ordered set of output ports, the output signals of the filter network, generated in response to h(t), are sampled at a single time, T. These output signals are processed to determine the values of parameters $\{r_i\}$ and $\{s_i\}$ of th analog signal. These parameters may be utilized to reconstruct the analog signal or for other purposes.

Because the signal is sample only once, at time T, aliasing errors are not present in the sampled values of the signal.

In one application, the analog signal may be the impulse response of a linear network under test (NUT). In this case, the parameters $\{s_i\}$ and $\{r_i\}$ are the poles and residues, respectively, of the transfer function, H(s), of NUT, where s is the frequency in the complex frequency domain.

According to one embodiment of the invention, the measurement system includes a filter bank of N parallel connected, linearly independent filter elements. This implies that none of the filters in the bank can be synthesized from a linear combination of the other filter bank members. For example, a bank filters having orthogonal impulse responses would belong to the admissible set of filters. The input port of the filter bank is coupled to receive the input transient signal or may be coupled to the output port of the NUT. In addition, the phase shift at any given output port is a linear function of its order in the ordered set of output ports of the filter bank.

The transfer function, H(z), of a filter bank system maps the poles and residues, $s_i$ and $r_i$ of H(s) into the poles and residues, $z_i$ and $\rho_i$, of H(z), where z is the complex frequency in the z domain. Accordingly, when the quantities $z_i$ and $\rho_i$ are evaluated they may be transformed to evaluate $s_i$ and $r_i$.

According to one aspect of the invention, an impulse stimulus is applied to the NUT at time t=0. The values of the output signals at the N filter bank output ports are sampled at time t=T. These sampled values are the elements of a filter set output vector.

According to a further aspect of the invention, the filter bank output vector is utilized to determine the values of $z_i$ and $\rho_{n,i}$.

In one embodiment, the filter set output vector is used to form a general Augmented Data Matrix, G. The matrix G is inverted and applied to the filter set output vector to generate the values of coefficients of the proper rational fractional polynomial form of H(z). Once these coefficients have been evaluated the poles and residues, $z_i$ and $\rho_{n,i}$, of H(z) may be evaluated by a partial fraction expansion. The quantities $s_i$ and $r_i$ and higher order residues $r_{n,i}$ are evaluated by transforming $z_i$ and $\rho_{n,i}$.

In a preferred embodiment, the transfer functions of the filter elements are selected so that the impulse response of the filter bank at the kth output port is $(\alpha t)^k/k! e^{\alpha t/z}$ where $\alpha$ is physical scaling parameter, and k is the rank of the output in the ordered set. This response is a matheatical function denoted the kth order Poisson kernel.

According to another aspect of the invention, a Poisson Augmented Data Matrix is constructed and applied to the sampled filter network to generate a set of numerical coefficients. Next, these numerical coefficients are utilized to determine the value of the poles $\{z_i\}$ and residues $\{\rho_i\}$ of H(z). Finally, these $\{z_i\}$ and $\{\rho_i\}$ are utilized to determine $\{s_i\}$ and $\{\rho_i\}$.

According to a further aspect of the invention, the general filter set output vector is transformed to a Poisson filter set output vector. The Poisson augmented data matrix is then utilized to determine the values of $s_i$ and $r_i$.

In one embodiment, the elements of the filter set output vector are digitized and stored in a digital memory. A programmed digital processor then operates the elements of the vector to evaluate $s_i$ and $r_i$.

In a particular embodiment, the outputs of the filter bank are each coupled to the input port of a sample-and-hold (S/H) element. The output ports of the S/H elements are couple to the input port of an ADC by a selectable switch.

Other features and advantages of the invention will become apparent in view of the drawings and following detailed description.

BRIEF DESCRIPTION OF THE DRAWINGS

FIG. 1 is a schematic diagram of an embodiment of the invention.

FIG. 2 is a graph depicting bandwidth compression.

FIG. 3 is a mathematical expression of the general Augmented Impulse Data Matix.

FIG. 4 is a mathematical expression of the general Non-Impulse Augmented Data Matrix.

DETAILED DESCRIPTION OF THE PREFERRED EMBODIMENTS

The present invention is a system for determining the s-plane parameters of a transient unsampled (continuous) analog signal without directly sampling the signal at periodic intervals of time. Thus, aliasing errors are avoided. In the system of the present invention, the outputs of a filter bank are sampled only once at T seconds after the application of an input signal. These filter bank outputs are processed to obtain the values of the s-plane parameters $r_i$ and $s_i$ characterizing the input signal.

FIG. 1 is a schematic diagram of an embodiment of the present invention. A network-under-test (NUT) 10 has input and output ports 10i and 10o. Output port 10o is coupled to the input port of a serially connected filter bank 12. The filter bank 12 is formed of individual filter elements 12(n), n=1 ..., N. The output port of each filter elememt is coupled to the input port of a sample and hold element 14(n), n=1,..., N. The output of the nth filter element 12(n) is coupled to the input port of the nth S/H element 14(n).

The output ports of the S/H elements 14 are coupled to the input ports of a selectable switch element 16. The output port of switch element 16 is coupled to the input port of an analog-to-digital converter (ADC) 18. The output port of the ADC 18 is coupled to the input port of a digital memory element 20. A digital processor 22 is coupled to the I/O ports of the memory 20.

The transfer function of each filter element 12, except the first, is equal to $\alpha/(s+\alpha/2)$. The transfer function of the first filter element 12(1) is $1/(s+\alpha/2)$. These functions simplify the following algebraic development. The impulse response of the first filter is $$h_o(t) = e^{-\alpha t/2}$$

and all subsequent filters have impulse response of $$h_k(t) = \alpha e^{-\alpha t/2}, k \neq 0.$$

The effective impulse response of the kth output terminal is the convolution of all prior impulse responses corresponding to the product of their Laplace transforms $$H_k(s) \rightleftharpoons h_o(t) * h_1(t) * \cdots * h_k(t) = h^{(k)}(t)$$

or $$\frac{1}{s + \alpha/2} \left( \frac{\alpha}{s + \alpha/2} \right)^k \rightleftharpoons \frac{(\alpha t)^k}{k!} e^{-\alpha t/2} = h^{(k)}(t) \quad \text{(Eq. 1)}$$

The impulse response of the kth filter element 12(k) corresponds to the kth order Poisson kernel.

These Poisson kernels may be utilized to perform a Poisson transformation of a continuous signal. Because of the following Laplace transform relationship $$r_i e^{-s_i t} \rightleftharpoons r_i/s + s_i \quad \text{(Eq. 2)}$$

then $$\frac{r_i}{s + s_i} \rightleftharpoons \rho_i \left( \frac{\alpha}{\alpha/2 + s_i} \right)^k \quad \text{(Eq. 3)}$$

where $$\rho_i = r_i/(\alpha/2 + s_i) \quad \text{(Eq. 4)}$$

which establishes the relationship between the s-plane (Laplace) domain and the Poisson domain. It may be considered as two mappings $$r_i \rightleftharpoons \rho_i \quad \text{(Eq. 5)}$$

$$\frac{1}{s + s_i} \rightleftharpoons \left( \frac{\alpha}{\alpha/2 + s_i} \right)^k \quad \text{(Eq. 6)}$$

Because $s_i = \sigma_i + j\omega_i$ $$\frac{\alpha}{\alpha/2 + s_i} = e^{\gamma_i + j\Omega_i} = \frac{\alpha}{(\alpha/2 + \sigma_i) + j\omega_i} =$$

$$\frac{\alpha}{\sqrt{(\alpha/2 + \sigma_i) + \omega_i^2}} e^{-j \tan^{-1} \omega_i/(\alpha/2 + \sigma_i)} \quad \text{(Eq. 7)}$$

so that $$\gamma_i = \ln\{\alpha/\sqrt{(\alpha/2 + \sigma_i)^2 + \omega_i^2}\} \quad \text{(Eq. 8)}$$

$$\Omega_i = -\tan^{-1}(\omega_i/(\alpha/2 + \sigma_i)) \quad \text{(Eq. 9)}$$

Thus, $$e^{-s_i t} \rightleftarrows e^{(\gamma_i + j\Omega_i)k} \quad \text{(Eq. 10)}$$

It is known that if the Poisson transformation of a continuous signal is taken, the Poisson coefficients, representing the continuous signal, form a discrete series in the Poisson domain that may be used to model the system behavior (to which the signal corresponds) using discrete numerical methods as in a computer. Thus, continuous convolution in the time domain corresponds to a discrete convolution of sampled data in the Poisson domain. The process is invertible by means of a Laguerre transformation. Not surprisingly, Laguerre functions, being a linear combination of Poisson kernels, exhibit the same type of properties.

The kth order Poisson kernel is defined as $(\alpha t)^k/k! e^{-\alpha t/2}$ and the kth order coefficient of the continuous signal $y(t)$ is defined as $$Y(k) = \int_0^\infty (\alpha t)^k/k! \, e^{-\alpha t/2} y(t)dt \quad \text{(Eq. 11)}$$

If $$y(t) = r_i e^{-s_i t}$$

then $$Y(k) = r_i \alpha^k/k! \int_0^\infty t^k e^{-(\alpha/2 + s_i)t} dt \quad \text{(Eq. 12)}$$

or $$Y(k) = r_i \alpha^k/(\alpha/2 + s_i)^{k+1} \quad \text{(Eq. 13)}$$

Thus, $$r_i e^{-s_i t} \rightleftarrows \frac{r_i}{\alpha/2 + s_i}\left(\frac{\alpha}{\alpha/2 + s_i}\right)^k \quad \text{(Eq. 14)}$$

A continuous complex exponential in the time-domain transforms into a discrete ($k=0,1,2\ldots$) complex exponential in the transform domain?

A continuous complex exponential remains a complex exponential after the transformation except that it has a discrete argument, k.

The bandwidth in the k domain is obtained from:

$$\Omega_i = -\tan^{-1}\{\omega_i/(\alpha/2 + \sigma_i)\} \quad \text{(Eq. 15)}$$

This function is graphed in FIG. 2 and the frequency relationship implies a distortion of the $\omega$-axis such that $|\omega| < \infty$ maps onto a band of $-\pi/2 < \Omega_i < +\pi/2$. Thus, the transformation compresses the infinite bandwidth to a finite bandwidth which, in turn, permits a discrete equivalent representation of $$e^{-s_i t}$$

If $$x(t) = e^{-s_i t}$$

where x(t) is the input signal from the NUT 10 to the filter block 12, then the output of the kth filter is the convolution of x(t) with $h^{(k)}(t)$ being the impulse response of the kth filter element:

The output of the kth filter element 12(k), at time T, to the input signal x(t) is:

$$y_k(T) = \alpha^k/k! \int_0^T \tau^k e^{-\alpha \tau/2} x(t-\tau)d\tau \quad \text{(Eq. 16)}$$

that is, the convolution of the impulse response with the input function.

$$y_k(t) = \alpha^k/k! \int_0^T \tau^k e^{-\alpha\tau/2} e^{-s_i(t-\tau)} d\tau$$

$$= \alpha^k e^{-s_i t} \int_0^T \tau^k e^{-(\alpha/2 - s_i)\tau} d\tau$$

or $$y_k(T) = \frac{\alpha^k e^{-s_i T}}{(\alpha/2 - s_i)^{k+1}} - \quad \text{(Eq. 19)}$$

$$\frac{\alpha^k e^{-\alpha T/2}}{(\alpha/2 - s_i)^{k+1}} \sum_{m=0}^{k} \left[\frac{(\alpha/2 - s_i)T}{(k-m)!}\right]^{k-m}$$

The first term seems to have a form proportional to the Poisson transformation given in Eq. 14 except that the denominator is the difference, $\alpha/2 - s_i$, rather than the sum, $\alpha/2 + s_i$, and a "gain" term, $$e^{-s_i T},$$

is present.

The second term is a "spurious" function involving a gain term of $e^{-\alpha T/2}$ and a finite series of expansion of $$e^{(\alpha/2 - s_i)T}.$$

The first term would be an obvious acceptable and usable result without the second term. It corresponds to a different but acceptable mapping of the function in the Poisson domain.

If $\alpha T/2$ is selected so that $e^{-\alpha T/2}$ is negligible compared to $$e^{-s_i T},$$

then $$Y_k(T) = \alpha^k e^{-s_i T}/(\alpha/2 - s_i)^{k+1} \quad \text{(Eq. 19a)}$$

For an input function x(t) consisting of a sum of complex exponentials weighted by their associated residues, $r_i$, $$x(t) = \sum_i r_i e^{s_i t}$$

the output from each filter is:

$$y_k(T) = \sum_i r_i \frac{\alpha}{k!} e^{ki} \int_0^T \tau^k e^{-(\alpha/2 - s_i)\tau} d\tau \quad \text{(Eq. 20)}$$

Note that these $y_k(T)$ are data elements, sampled in k space at time T, of the response of the filter bank system to a transient stimulus.

The operation of the system depicted in FIG. 1 to measure y(k), k=1, ..., N will now be described using an impulse stimulus.

Referring again to FIG. 1, an impulse function is applied to the input port of the NUT 10 at time t=0. The output of the NUT 10 is the impulse response function, $$h(t) = \sum_i r_i e^{s_i t} = x(t).$$

This impulse response function is transmitted through the filter bank 10. The output of each filter element 12 is simultaneously sampled and held by the S/H elements 14 at time T. These sampled outputs are the analog values $y_k(T)$.

The switch element 16 sequentially transfers the sampled values to the input port of the ADC 18. The ADC converts the analog sampled values to digital values and stores these digital values in the memory 20.

The outputs are sampled only once at time T. Thus, the problems of aliasing are avoided. Instead of obtaining a series of signal values sampled over a time interval, a series of values, $y_k(T)$, are obtained as the outputs of the filter elements 12. The filters effect a transformation to a "filter space" defined by the dimension k.

This transformation maps the s-plane parameters $r_i$ and $s_i$, i.e., the poles and residues of the NUT transfer function, into poles and residues of the domain transfer function, H(z), of the combined filter bank network.

The following is a description of a method for determining the values of the poles and residues of H(z) and for determining the form of the transform for obtaining the s-plane parameters, $s_i$ and $r_i$.

The transformation from the time domain representation to the filter space representation is given by $$\sum_i r_i e^{s_i t} \rightleftharpoons y_k(T), \quad 0 \leq t \leq T \quad \text{(Eq. 21)}$$

where $y_k(T)$ is defined by Eq. 20. For the purpose of clarity in the following development consider a single normalized component of x(t), and the response to its application to the filter bank. Let that component be $$e^{s_i t}$$

With the substitution $$\beta_i = 1/(\alpha/2 - s_i) \quad \text{(Eq. 22)}$$

Eq. 18 becomes:

$$y_{k,i}(t) = \alpha^k \beta_i^{k+1} e^{-s_i t} - \quad \text{(Eq. 23)}$$

$$\alpha^k \beta_i^{k+1} e^{-\alpha t/2} \sum_{m=0}^{k} 1/(k-m)! \, (t/\beta_i)^{k-m}$$

Note that the ordered set of coefficients, $\{y_{k,i}(t)\}$ with k=0, 1, ..., is a function of the variable k. The z-transform, corresponding to the k dimension, of $y_{k,i}(t)$ over the range of $0 \leq k \leq N-1$, is given by the following equation:

$$Y_i(N, z) = \beta_i e^{-s_i t} \left[ \frac{1 - (\alpha \beta_i z^{-1})^N}{1 - \alpha \beta_i z^{-1}} \right] - \quad \text{(Eq. 24)}$$

$$\frac{\beta_i e^{-\alpha t/2}}{1 - \alpha \beta_i z^{-1}} \left[ \sum_{m=0}^{N-1} \frac{(\alpha t z^{-1})^m}{m!} - (\alpha \beta_i z^{-1})^N \sum_{m=0}^{N-1} \frac{\beta_i^{-m} t^m}{m!} \right]$$

Evaluating this z-transform for N→∞ (an infinite number of filters) yields:

$$\lim_{N \to \infty} Y_i(N, z) = Y_i(z) = \frac{\beta_i e^{-s_i t}}{1 - \alpha \beta_i z^{-1}} - \frac{\beta_i e^{-\alpha t/2}}{1 - \alpha \beta_i z^{-1}} [e^{-\alpha t/z}] \quad \text{(Eq. 25)}$$

or $$Y_i(z) = \frac{\beta_i [e^{-s_i t} - e^{-(1 - 1/z)\alpha t}]}{1 - \alpha \beta_i z^{-1}} \quad \text{(Eq. 26)}$$

The ith pole of the z-transform is located at $$z_i = \alpha \beta_i = \alpha / (\alpha/2 - s_i) \quad \text{(Eq. 27)}$$

but has a rather odd appearing residue, as represented by the numerator. (In fact, $e^{\alpha t/z}$, corresponds to an essential singularity at z=0. Its value depends on the direction of approach) if $$H(z) = \sum_i r_i Y_i(z), \quad \text{(Eq. 28)}$$

substituting the form of $Y_i(z)$ in Eq. 26 into Eq. 28 gives:

$$H(z) = \sum \frac{r_i \beta_i e^{-s_i t}}{1 - \alpha \beta_i z^{-1}} - e^{-\alpha t(1 - z^{-1})i} \sum \frac{r_i \beta_i}{1 - \alpha \beta_i z^{-1}} \quad \text{(Eq. 29)}$$

It is clear that Eq. 29 represents the specific transfer function for a Poisson filter set. However, if a different linearly independent filter set, e.g., Laguerre filters, are utilized then the specific algebraic form of $Y_i(z)$ would be different from Eq. 26. The relationship of Eq. 28 would still be valid for $Y_i(z)$ calculated from the impulse responses of the substituted filter elements.

The expression for H(z) in Eq. 29 may then be put in a quasi-rational fractional form as follows:

$$H(z) = \frac{b_0 + b_1 z^{-1} + \ldots + b_{p-1} z^{-(p-1)}}{1 + a_1 z^{-1} + \ldots + a_p z^{-p}} - \quad \text{(Eq. 30)}$$

$$\frac{b_0 + b_1 z^{-1} + \ldots + b_p z^{-(p-1)}}{1 + a_1 z^{-1} + a_2 z^{-2} + \ldots + a_p z^{-p}} e^{\alpha t z^{-1}}$$

where the terms $e^{-s_i t}$ and $e^{-\alpha t/z}$ have been absorbed into the numerator constants.

If the substitution $$e^{\alpha t/z} = \sum_{m=0}^{\infty} \frac{(1)}{m!} (\alpha t z^{-1})^m \quad \text{(Eq. 31)}$$

is made into Eq. 30, then $$H(z) = \frac{\sum_{q=0}^{p-1} b_q z^{-q} - (1 + (\alpha t z^{-1})/1! + (\alpha t z^{-1})^2/2! + \ldots) \sum_{q=0}^{p-1} b_q' z^{-q}}{1 + \sum_{q=1}^{p} a_q z^{-q}} \quad \text{(Eq. 32)}$$

where p is the number of poles of the filter system transfer function. But if H(z) is considered to be a transfer function (z-transform of a sampled impulse response)

$$H(z) = \frac{Y(z)}{X(z)} = Y(z) \quad \text{(Eq. 33)}$$

and because $X(z)=1$ (due to assuming an impulse was applied to the NUT), then from Eq. 32, $$Y(z)\left[1 + \sum_{q=1}^{p} a_q z^{-q}\right] = \quad \text{(Eq. 34)}$$

$$\sum_{q=0}^{p-1} b_q z^{-q} - (1 + (\alpha t z^{-1})/1! + (\alpha t z^{-1})^2/2! + \ldots) \sum_{q=0}^{p-1} b_q' z^{-q}$$

which has an inverse $z^{-1}$ transformation as follows:

$$y(k) + \sum_{q=1}^{p} a_q y(k-q) = \quad \text{(Eq. 35)}$$

$$\sum_{q=0}^{p-1} b_q \delta(k-q) - \sum_{m=0}^{\infty} (\alpha t)^m/m! \, \delta(n-m) * \sum_{m=0}^{p-1} b_q' \delta(k-q)$$

where $\delta(k-n) = \{1, n=k; 0, \text{otherwise}\}$ and where $$\sum_m (\alpha t)^m/m! \, \delta(k-m) * \sum_q b_q' \delta(k-q) = \quad \text{(Eq. 36)}$$

$$\sum_m \sum_q b_q' (\alpha t/m!)^m \delta(k-m-q)$$

so that $$y(k) = \sum_{q=0}^{p-1} b_q \delta(k-q) - \quad \text{(Eq. 37)}$$

$$\sum_{m=0}^{\infty} \sum_{q=0}^{p-1} b_q' (\alpha t/m!)^m \delta(k-m-q) - \sum_{q=1}^{p} a_q y(k-q)$$

The values y(k) are the digitized, sampled output values of the filter set output vector.

$y(k) = y_k(t)$

If $p=4$, $0 \leq k \leq 11$, and $y(k) = y_k$, equating simultaneous events in the variable n, yields:

$$\begin{bmatrix} y_0 \\ y_1 \\ y_2 \\ y_3 \\ y_4 \\ y_5 \\ y_6 \\ y_7 \\ y_8 \\ y_9 \\ y_{10} \\ y_{11} \end{bmatrix} = - \begin{bmatrix} -1 & 1 & & & & & & & \\ -1 & \frac{\alpha T}{1!} & 1 & & & & & & \\ -1 & \frac{(\alpha T)^2}{2!} & \frac{\alpha T}{1!} & 1 & & & & & \\ -1 & \frac{(\alpha T)^3}{3!} & \frac{(\alpha T)^2}{2!} & \frac{\alpha T}{1!} & 1 & & & & \\ & \frac{(\alpha T)^4}{4!} & \frac{(\alpha T)^3}{3!} & \frac{(\alpha T)^2}{2!} & \frac{\alpha T}{1!} & y_3 & y_2 & y_1 & y_0 \\ & \frac{(\alpha T)^5}{5!} & \frac{(\alpha T)^4}{4!} & \frac{(\alpha T)^3}{3!} & \frac{(\alpha T)^2}{2!} & y_4 & y_3 & y_2 & y_1 \\ & \frac{(\alpha T)^6}{6!} & \frac{(\alpha T)^5}{5!} & \frac{(\alpha T)^4}{4!} & \frac{(\alpha T)^3}{3!} & y_5 & y_4 & y_3 & y_2 \\ & \frac{(\alpha T)^7}{7!} & \frac{(\alpha T)^6}{6!} & \frac{(\alpha T)^5}{5!} & \frac{(\alpha T)^4}{4!} & y_6 & y_5 & y_4 & y_3 \\ & \frac{(\alpha T)^8}{8!} & \frac{(\alpha T)^7}{7!} & \frac{(\alpha T)^6}{6!} & \frac{(\alpha T)^5}{5!} & y_7 & y_6 & y_5 & y_4 \\ & \frac{(\alpha T)^9}{9!} & \frac{(\alpha T)^8}{8!} & \frac{(\alpha T)^7}{7!} & \frac{(\alpha T)^6}{6!} & y_8 & y_7 & y_6 & y_5 \\ & \frac{(\alpha T)^{10}}{10!} & \frac{(\alpha T)^9}{9!} & \frac{(\alpha T)^8}{8!} & \frac{(\alpha T)^7}{7!} & y_9 & y_8 & y_7 & y_6 \\ & \frac{(\alpha T)^{11}}{11!} & \frac{(\alpha T)^{10}}{10!} & \frac{(\alpha T)^9}{9!} & \frac{(\alpha T)^8}{8!} & y_{10} & y_9 & y_8 & y_7 \end{bmatrix} \begin{bmatrix} b_0 \\ b_1 \\ b_2 \\ b_3 \\ b_0' \\ b_1' \\ b_2' \\ b_3' \\ a_1 \\ a_2 \\ a_3 \\ a_4 \end{bmatrix} \quad \text{(Eq. 38)}$$

⟵ center columns ⟶ or symbolically $$y = Pc \quad \text{(Eq. 39)}$$

The general form of P, for arbitrary n and p values, is depicted in FIG. 3 with $\gamma_k = (\alpha T)^k/k!$. Hence, $$c = P^{-1} y \quad \text{(Eq. 40)}$$

where $P^{-1}$ is to be interpreted as the psuedo-inverse if P is a non-square (rectangular) matrix.

Also y is the Poisson filter-set output vector consisting of $k+1$ data points, P is the augmented impulse Poisson data matrix of dimensions $(k \times 3p)$, and c is the coefficient matrix of dimensions $3p \times 1$.

The numerical values of the coefficients $a_q$, $b_q$, $b_q'$ are now evaluated. These values are substituted into the following equations.

$$\frac{\sum_{q=0}^{p-1} b_q z^{-q}}{1 + \sum_{q=1}^{p} a_q z^{-q}} = \sum_{i=1}^{p} \frac{\rho_i}{1 - \alpha\beta_i z^{-1}} \qquad \text{(Eq. 41)}$$

or $$\frac{\sum_{q=0}^{p-1} b_q' z^{-q}}{1 + \sum_{q=1}^{p} a_q z^{-q}} = \sum_{i=1}^{p} \frac{\rho_i'}{1 - \alpha\beta_i z^{-1}} \qquad \text{(Eq. 42)}$$

The numerical values of the poles, $z_i$, and their associated residues, $\rho_i$, of the expressions on the left side of Eqs. 41 and 42 may be evaluated utilizing a partial fraction expansion. If higher order poles are present, the partial fraction expansion will contain higher order terms, i.e., $m-1$ additional terms for each multiple factor $(1-\alpha\beta_i Z^{-1})^m$ of the denominator. The values of the s-plane parameters, $s_i$ and $r_i$, are then obtained from the following transformations:

$$z_i = \alpha\beta_i = \alpha/(\alpha/2 - s_i) \qquad \text{(Eq. 43)}$$

so that $$s_i = \alpha(z_i/2 - 1)/z_i \qquad \text{(Eq. 44)}$$

and similarly $$\rho_i = r_i \beta_i e^{-s_i t} = r_i e^{-s_i t}/(\alpha/2 - s_i) \qquad \text{(Eq. 45)}$$

or $$r_i = \rho_i(\alpha/2 - s_i)e^{+s_i t} \qquad \text{(Eq. 46)}$$

Also $$\rho_i' = r_i \beta_i e^{-\alpha t/2} \qquad \text{(Eq. 47)}$$

so that $$r_i = \rho_i'(\alpha/2 - s_i)e^{+\alpha t/2} \qquad \text{(Eq. 48)}$$

In the present invention, the measured $y(k)$ and T values stored in the memory 20 (FIG. 1) are transferred to the processor 22 and, along with the known value of $\alpha$, are utilized to generate the elements, $p_{i,j}$, $i,j = 1, \ldots, N$, of the Augmented Poisson data matrix (FIG. 3). The matrix P is inverted utilizing standard techniques and applied to the Poisson filter-set vector to determine the elements, $a_q$, $b_q$, and $b_q'$, of the co-efficient vector. Note that $\gamma_k = (\alpha T)^k/k!$.

A partial fraction expansion, utilizing standard techniques, is then performed on the expressions on the right side of the Eqs. 41 and 42 to determine the poles and residues, $z_i$ and $\rho_i$.

Finally, the transformations of Eqs. 44 and 46 are applied to determine $s_i$ and $r_i$.

Hence, the original continuous input function may be reconstructed $$y(t) = \sum_i r_i e^{-s_i t}$$

Clearly, higher order terms of the form $$\sum_{m=1}^{m} r_{mi} \frac{t^m}{m!} e^{-\alpha t}$$

will be present if $m^{th}$ order poles are present.

Thus, the system of the present invention is capable of capturing data from a continuous input signal that has been transformed by a set of filter elements whose output is sampled (simultaneously) T seconds after the application of the input signal, and that data can be fully representative of the input signal so that the input signal may be constructed.

Alternatively, the same data may be used to characterize the parameters describing the signal in the Laplace domain as poles and residues or in other equivalent informational forms such as Laguerre function coefficients.

Also, it is recognized that many different filter forms may be concatenated to produce an equivalent result. For example, Laguerre functions which have inputs responses $h_k(t) = l_k(\alpha t)$ where $l_k(\alpha t)$ is the kth order Laguerre function:

$$l_k(\alpha t) = \sqrt{\alpha} \, e^{-\alpha t/2} \sum_{q=0}^{k} \frac{k! \, (-\alpha t)^q}{(k-q)! q! q!} \qquad \text{(Eq. 49)}$$
$$= \sqrt{\alpha} \sum_{q=0}^{k} \frac{k!}{(k-q)! q!} h_q(t)$$

where $h_q(t)$ are the Poisson kernels. Thus, the Laguerre functions constitute a linear combination of Poisson kernels. Their Laplace transforms pairs are $$l_k(\alpha t) \rightleftarrows \frac{\sqrt{\alpha}}{s + \alpha/2} \left( \frac{s - \alpha/2}{s + \alpha/2} \right)^k \qquad \text{(Eq. 50)}$$

The relationship between the transfer function, $H(z)$, the coefficient vectors, $a_q$, $b_q$, $b_q'$, and the filter output sequence, $y(k)$, are given by Eqs. 32 and 37. The Poisson filter output sequence is expressed in terms of a Laguerre filter sequence, $y'(k)$, by the linear transformation:

$$y(n) = 1/\sqrt{\alpha} \sum_{q=0}^{n} \frac{n!}{(n-q)! q!} y'(q) \qquad \text{(Eq. 51)}$$

This transformation may be utilized to solve for the parameter coefficient matrix, c, of Eq. 40.

Therefore, if the filter elements 12 are Laguerre filters then the processor 22 is programmed to transfer the Laguerre filter-set output vector, $y'(k)$, to the Poisson filter set output vector, $y(k)$, prior to forming the Augmented Impulse Poisson data matrix.

Because the Laguerre functions, $\{l_k(\alpha t)\}$, constitute a complete orthogonal set, other filter forms can be synthesized from Laguerre filter forms. This implies that an infinitely large set of possible filters may be used for the purpose described, because being synthesizable by Laguerre functions, a one-to-one mapping to the Poisson equivalent can be made. Accordingly, the principles of the invention are applicable to any filter bank comprising linearly independent filter elements.

If a general linearly independent set of filter elements is utilized, the processor 22 must first transform the general filter-set output vector to a Laguerre filter-set output vector. This transformation is always possible because the Laguerre functions form a complete orthogonal set.

The techniques for transforming the output vector, $\{y_k''\}$ generated by any arbitrary filter bank comprising linearly independent filter elements to the equivalent Poisson representation, $\{y_k\}$, is described in standard linear algebra textbooks, for example the book by Marcus et al. entitled *Introduction to Linear Algebra*, MacMillan, N.Y., 1965 at pg. 46. Further, procedures for utilizing a processor to implement these transformations are well-known in the art and not part of the invention.

Instead of transforming the general filter set output vector to the Poisson filter set output vector the general Augmented Data Matrix may be formed for a general filter bank. As described above, Eq. 29 represents the general NUT/filter bank transform with $Y_i(z)$s calculated utilizing the impulse responses of the filter elements in the general filter bank. The computational techniques illustrated in Eqs. 31–37 are then utilized to form the general Augmented Data Matrix, G. The matrix G is then inverted and applied to the general filter set output vector to determine the general coefficient vector. The computational techniques illustrated by Eqs. 41–48 are then utilized to determine $s_i$ and $r_i$.

Finally, the above observation suggests a means for either correcting the transfer characteristics of less than ideal filters by say a set of Laguerre filters or for compensating for their less than ideal transfer characteristics numerically.

By reference to Eq. 19A, it may be shown that if $e^{-\alpha T/2}$ is negligible ($\approx 0$), relative to $$e^{-s_iT},$$

then Eq. 23 becomes $$y_{k,i}(t) = \alpha^k \beta_i^k e^{-s_iT} \qquad \text{(Eq. 52)}$$

so that Eq. 24 becomes $$Y_i(N,z) = \beta_i e^{-s_iT} \left[ \frac{1 - (\alpha\beta z^{-1})^N}{1 - \alpha\beta z^{-1}} \right] \qquad \text{(Eq. 53)}$$

and Eq. 26 becomes $$Y_i(N,z) = \frac{\beta_i e^{-s_iT}}{1 - \alpha\beta z^{-1}} \qquad \text{(Eq. 54)}$$

and Eq. 29 becomes $$H(z) = \Sigma \frac{r_i \beta_i e^{-s_iT}}{1 - \alpha\beta_i z^{-1}} \qquad \text{(Eq. 55)}$$

Hence, the problem of extracting the parameters reduces to well known techniques such as described by Willsky in his book, "Digital Signal Processing And Control And Estimation Theory", MIT Press, Cambridge, MA, Second Printing (1979), pp. 25–67, because Eq. 55, which is in a partial fraction expansion form, may be expressed as a ratio of polynomials. Specifically, $$H(z) = \frac{b_0 + b_1 z^{-1} + \ldots + b_{p-1} z^{-(p-1)}}{1 + a_1 z^{-1} + \ldots + a_p z^{-p}} \qquad \text{(Eq. 56)}$$

which corresponds to the first term on the right hand side of Eq. 30.

By letting $e^{-\alpha T/2} \approx 0$, the set of coefficients $\{b_k'\}$ are set to zero so that the center section of the p matrix in Eqs. 38 and 39 are set to zero, greatly simplifying the computations involved in determining the coefficient vector, C. A similar modification of the center p colums of the matrix of FIG. 2 would result.

If the signal under observation is not an impulse responsse but a set of transient response $\{y_k(t)\}$ to a signal, which when applied to the apparatus described, produces a set of transient responses $\{\mu_k(t)\}$, then the matrix relationship $$y = P c \qquad \text{(Eq. 39)}$$

still applies provided that the P matrix is interpreted to be the matrix depicted in FIG. 4.

Where, in FIG. 4 $\gamma_k = (\alpha T)^k/k!$ and $\mu_k = \mu_k(T)$, and P' is the Augmented Non-Impulse Data Matrix.

Note that the left hand column is more complex than the matrix defined by Eq. 38 because the one's resulting from the impulse function are replaced by the $\mu$'s.

The invention has now been described with reference to specific embodiments. Modifications and substitutions will now be apparent to persons of skill in the art. In particular, the illustrated circuit for sampling the filter set vector is not critical to the invention. Further, the specific computational steps are intended to provide an example of one method for evaluating $s_i$ and $r_i$. Equivalent mathematical techniques may be utilized. It is understood that techniques for programming a processor to perform the various required mathematical operations are well-known in the art and not part of the present invention. Accordingly, it is not intended that the invention be limited except as provided by the appended claims.

What is claimed is:

1. A system for processing an ordered set of output signals generated by a filter network having an input port, for receiving an analog signal, and having an ordered set of output ports for outputting respective ones of said output signals, where the output signal at the first output port generated in response to an impulse signal at the first input port is $$e^{-\alpha t/2}$$

and the kth output port is $$\frac{(\alpha t)^k e^{-\alpha t/2}}{k!},$$

where $\alpha$ is a known, physical scaling parameter, t is time measured from the receipt of the impulse, and k is the rank of the output port, and where the analog signal, x(t) may be represented by the formula $$x(t) = \sum_i r_i e^{s_i t}$$

where $r_i$ and $s_i$ are complex numbers, and where $x(t)$ is the response of a linear system to an impulse function, said system comprising:

means for sampling the ordered set of output signals at a known time T, with the sampled value of the kth output signal equal to $y_k$, where the ordered set of $y_k$s is the Poisson filter-set output vector;

means for assigning values to the terms of the defined Augmented Impulse Poisson Data matrix P, using the known values of $\alpha$ and T;

means for inverting the Augmented Impulse Data Matrix to form $P^{-1}$;

means for multiplying said output vector by the matrix $P^{-1}$ to form a co-efficient vector, and means for operating on the terms of the co-efficient vector to calculate the values of $r_i$ and $s_i$.

2. The invention of claim 1 wherein the magnitude $e^{-\alpha t}$ is much smaller than $$e^{-s_i t}.$$

3. A system for processing an ordered set of output signals generated by a filter network having an input port, for receiving an analog signal, and having an ordered set of output ports for outputting respective ones of said output signals, where the output signal at the first output port generated in response to an impulse signal at the first input port is $$h^{(O)}(t)$$

and the kth output port is $$h^{(k)}(t)$$

where t is time measured from the receipt of the impulse, k is the rank of the output port, the set of functions $\{h^{(k)}(t)\}$ are mutually linearly independent functions of t in the sense that a given one of the functions in the set cannot be synthesized by a linear combination of the remaining functions in the set, and where the analog signal, $x(t)$ may be represented by the formula $$x(t) = \sum_i r_i e^{s_i t}$$

where $r_i$ and $s_i$ are complex numbers, and $x(t)$ is the response of a linear system to an impulse function, said system comprising:

means for sampling the ordered set of output signals at a known time T, with the sampled value of the kth output signal equal to $y_k''$, where the ordered set of $y_k''$s is the filter-set output vector $\{y_k''\}$;

means for transforming the filter-set output vector $\{y_k''\}$ to the equivalent vector in the Poisson domain;

means for assigning values to the terms of the defined Augmented Impulse Poisson Data matrix P, using the known values and T;

means for inverting the Augmented Impulse Data Matrix to form $P^{-1}$;

means for multiplying said equivalent output vector in the Poisson domain by the matrix $P^{-1}$ to form a co-efficient vector, and means for operating on the terms of the co-efficient vector to calculate the values of $r_i$ and $s_i$.

4. A system for processing an ordered set of output signals generated by a filter network having an input port, for receiving an analog signal, and having an ordered set of output ports for outputting respective ones of said output signals, where the output signal at the first output port generated in response to an impulse signal at the first input port is $$e^{-\alpha t/2}$$

and the kth output port is $$\frac{(\alpha t)^k e^{-\alpha t/2}}{k!},$$

where $\alpha$ is a known, physical scaling parameter, t is time measured from the receipt of the impulse, and k is the rank of the output port, and where the analog signal, $x(t)$ may be represented by the formula $$x(t) = \sum_i r_i e^{s_i t}$$

where $r_i$ and $s_i$ are complex numbers, and where $x(t)$ is the response of a linear system to a set of transient signals $\{\mu_k(t)\}$, said system comprising:

means for sampling the ordered set of output signals at a known time T, with the sampled value of the kth output signal equal to $y_k$, where the ordered set of $y_k$s is the Poisson filter-set output vector;

means for assigning values to the terms of the defined Augmented Non-Impulse Poisson Data matrix P, using the known values of $\alpha$ and T;

means for inverting the Augmented Non-Impulse Data Matrix to form $P^{-1}$;

means for multiplying said output vector by the matrix $P^{-1}$ to form a co-efficient vector, and means for operating on the terms of the co-efficient vector to calculate the values of $r_i$ and $s_i$.

5. The invention of claim 4 wherein the magnitude $e^{-\alpha t}$ is much smaller than $$e^{-s_i t}$$

* * * * *